US006866523B2

(12) United States Patent
Yamashita

(10) Patent No.: US 6,866,523 B2
(45) Date of Patent: Mar. 15, 2005

(54) CONSTRUCTION FOR MOUNTING A TERMINAL, A CIRCUIT BOARD CONNECTOR AND METHOD OF MOUNTING IT

(75) Inventor: Kazunori Yamashita, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 10/600,322

(22) Filed: Jun. 20, 2003

(65) Prior Publication Data

US 2004/0005794 A1 Jan. 8, 2004

(30) Foreign Application Priority Data

Jun. 24, 2002 (JP) ........................................ 2002-182715

(51) Int. Cl.[7] ............................ H01R 12/00; H05K 1/00
(52) U.S. Cl. ......................................................... 439/79
(58) Field of Search ..................................... 439/79, 80

(56) References Cited

U.S. PATENT DOCUMENTS

| 4,762,498 | A | * | 8/1988 | Harting et al. ................. 439/82 |
| 4,867,710 | A | * | 9/1989 | Harting et al. ............... 439/751 |
| 4,878,861 | A | * | 11/1989 | Kendall et al. .............. 439/751 |
| 4,954,103 | A | * | 9/1990 | Liebich et al. ............... 439/751 |
| 5,453,016 | A | * | 9/1995 | Clark et al. .................... 439/79 |
| 5,639,249 | A | * | 6/1997 | Lenoir ........................... 439/79 |
| 5,692,912 | A | * | 12/1997 | Nelson et al. ................. 439/79 |
| 5,738,550 | A | * | 4/1998 | Sakuraoka et al. .......... 439/751 |
| 5,863,222 | A | * | 1/1999 | Kinsey et al. ............... 439/607 |
| 6,059,608 | A | * | 5/2000 | Benes ........................... 439/620 |
| 6,155,887 | A | * | 12/2000 | Cuff et al. ................... 439/751 |
| 6,447,307 | B1 | * | 9/2002 | Wu ................................ 439/79 |
| 6,719,573 | B2 | * | 4/2004 | Koehler et al. ................ 439/79 |

FOREIGN PATENT DOCUMENTS

DE 196 08 168 9/1997

* cited by examiner

Primary Examiner—Javaid H. Nasri
(74) Attorney, Agent, or Firm—Gerald E. Hespos; Anthony J. Casella

(57) ABSTRACT

A positioning plate (50) is mounted to a circuit board connector (10), and has insertion holes (51) into which jig contacts (29) of terminals (20) are insertable. A depth (D) of the insertion holes (51) exceeds a length (L) of the jig contact (29) of the terminal (20). Thus, upon mounting the circuit board connector (10) on a circuit board (40), the resilient contacts (27) of each terminal (20) are inserted into a corresponding through hole (41) until the positioning plate (50) comes contacts the circuit board (40), whereby further insertion of the resilient contacts (27) is prevented. As a result, lower edges (29B) of the jig contacts (29) are spaced from the circuit board (40). Thus, the circuit board (40) cannot be damaged by the lower edges (29B) of the jig contacts (29).

15 Claims, 9 Drawing Sheets

CONSTRUCTION FOR MOUNTING A TERMINAL, A CIRCUIT BOARD CONNECTOR AND METHOD OF MOUNTING IT

BACKGROUND OF THE INVENTION

1. Field of the Invention

The invention relates to a construction for mounting a terminal into a circuit board, a circuit board connector and a method of mounting it to a circuit board.

2. Description of the Related Art

German Patent Publication No. 19608168 and FIG. 9 herein disclose a terminal that can be mounted to a circuit board without soldering. With reference to FIG. 9, the terminal 1 has a needle-eye shape formed by two resilient contacts 2 that bulge arcuately out so that a deformation permitting space 3 is defined between the resilient contacts 2. The terminal 1 is used with a circuit board 6 that has a through hole 7 with a contact portion 8 formed on the inner circumferential surface of the through hole 7. The two resilient contacts 2 deform resiliently and close as the terminal 1 is pressed through the through hole 7. Thus, the resilient contacts 2 are pressed against the inner circumferential surface of the through hole 7 by resilient forces acting in their opening directions. As a result, the terminal 1 is locked so as not to come out and establishes electrical connection with the contact portion 8 of the through hole 7.

The terminal 1 must be pressed with a stable pressing force through the through hole 7 against the forces of the resilient contacts 2. A jig contact 4 may bulge out toward opposite sides at a position above the resilient contacts 2 of the terminal 1. The resilient contacts 2 then are inserted through the through hole 7 by bringing a jig 5 into contact with the jig contact portion 4 to press the terminal 1.

Difficulties may arise in attempts to regulate a degree of pressing by the jig 5. If the degree of pressing becomes excessive, the lower edge of the jig contact 4 is pressed against the circuit board 6. Thus, an electrically conductive path 9 on the surface of the circuit board 6 may be damaged.

The invention was developed in view of the above problem and an object thereof is to enable a terminal to be mounted into a circuit board easily, securely and without damaging the circuit board.

SUMMARY OF THE INVENTION

The invention relates to a construction for mounting at least one terminal. The terminal comprises one or more resilient contacts to be inserted into a hole in a circuit board. The terminal also comprises a jig contact that bulges out at an angle to an inserting direction of the terminal from a location behind the resilient contacts with respect to the inserting direction of the resilient contacts. The jig contact can be engaged by a jig to press the resilient contact into the hole and to establish electrical connection with a contact portion of the circuit board. The construction comprises a positioning plate with at least one insertion hole into which the jig contact is insertable. A depth along the inserting direction of the insertion hole is at least equal to a length of the jig contact of the terminal. Thus, the jig contact remains spaced from the circuit board so that the contact between the jig contact and the circuit board can be avoided. Accordingly, a risk of damaging the circuit board is reduced.

The contact portion of the circuit board preferably is formed on the inner circumferential surface of the hole.

The jig contact is inserted into the insertion hole in the positioning plate, which is then pushed by the jig together with the jig contact. The depth of the insertion hole is at least equal to the length of the jig contact. Thus, the jig contact is pressed until the leading end comes to the same position as the leading end of the insertion hole with respect to the inserting direction or is more backward than the leading end of the insertion hole. The positioning plate contacts the circuit board when the resilient contacts are pressed into the through hole of the circuit board and further insertion of the resilient contacts is prevented. In this state, the jig contact slightly touches the circuit board together with the positioning plate or is immediately before the circuit board. As a result, the circuit board will not be damaged.

The jig contacts of the respective terminals are inserted individually into the insertion holes of the positioning plate. Thus, there is no danger that the jig contacts will contact each other to be short-circuited.

The positioning plate preferably is fixedly mountable to a connector housing of the circuit board connector.

The resilient contacts preferably are radially deformable by being pressed into the hole. Additionally, the resilient contact preferably is formed adjacent to one or more resilient deformable portions that may be thinned with respect to the resilient contact.

The hole of the circuit board preferably is a through hole.

Most preferably, the front edge of the jig contact is rounded.

The invention also relates to a circuit board connector comprising the above-described construction for mounting a terminal. The connector has a housing to be mounted to a circuit board, and one or more terminals to be mounted in the housing. Each terminal has at least one resilient contact to be inserted into a corresponding hole in the circuit board and a jig contact portion bulging in at an angle to an inserting direction from a location behind the resilient contacts with respect to the inserting direction. The jig contact can be pushed by a jig to press the resilient contacts into the hole for establishing electrical connection with a contact portion of the circuit board. A positioning plate is assembled with the housing and has at least one insertion hole into which the jig contacts of the terminals are insertable. A depth along the inserting direction of the insertion holes is substantially equal to or larger than a longitudinal length of the jig contacts of the terminals.

The contact portion of the circuit board preferably is formed on the inner circumferential surface of the hole.

The resilient contacts preferably are radially deformable while being pressed into the hole. The resilient contact portion may be formed adjacent one or more resilient deformable portions that are thinned with respect to the resilient contact portion.

Most preferably, the front edge of the jig contact portion is rounded.

The invention also relates to a method for assembling the above-described circuit board connector to a circuit board. The method comprises providing one or more terminals with resilient contacts for insertion into a corresponding hole in the circuit board and a jig contact bulging in a direction at an angle to an inserting direction thereof behind the resilient contacts with respect to the inserting direction. The method then includes inserting the jig contacts of the terminals into insertion holes of a positioning plate, and pressing the jig contact by a jig to press the resilient contacts into the hole to establish an electrical connection with a contact portion of the circuit board. A depth of the insertion holes is substantially equal to or larger than a longitudinal length of the jig contacts of the terminals.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
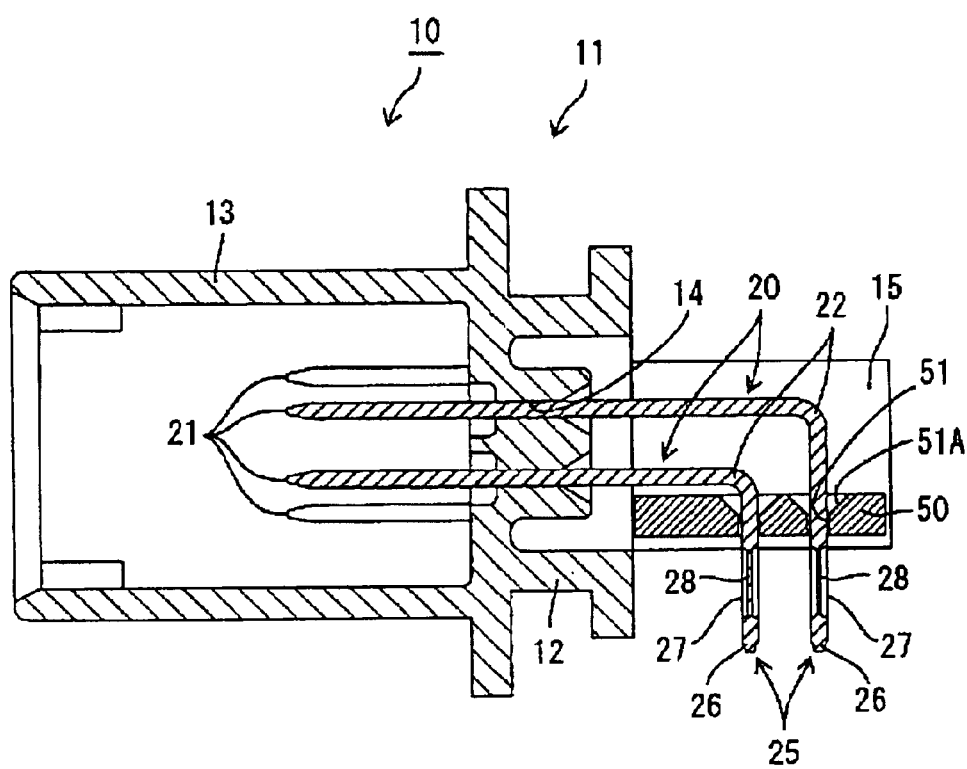
FIG. 1 is a longitudinal section of a circuit board connector according to one embodiment of the present invention.

A circuit board connector according to the invention is identified by reference numeral 10 in FIG. 1 and a mating side with a mating connector (left side in FIG. 1) is referred to as front side in the following description.

Figure 2:
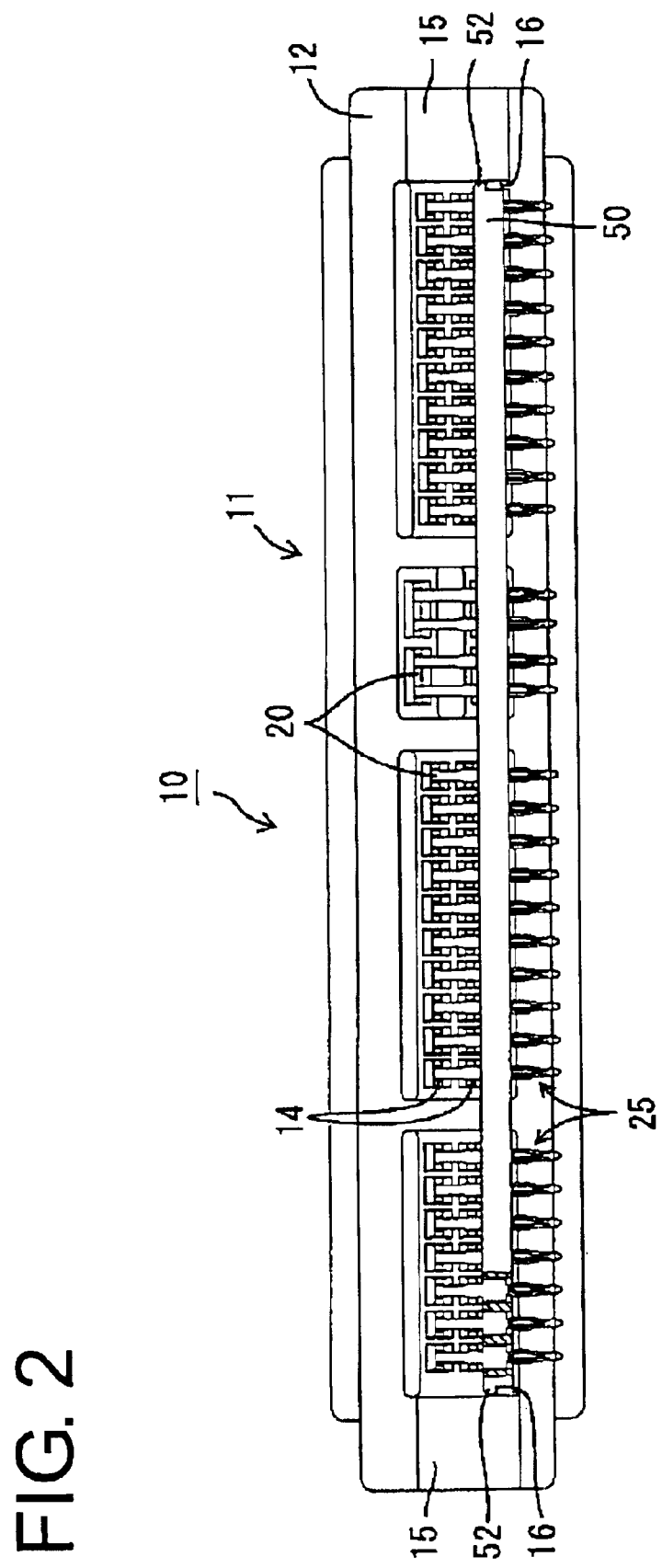
FIG. 2 is a rear view partly in section of the circuit board connector.
Figure 3:
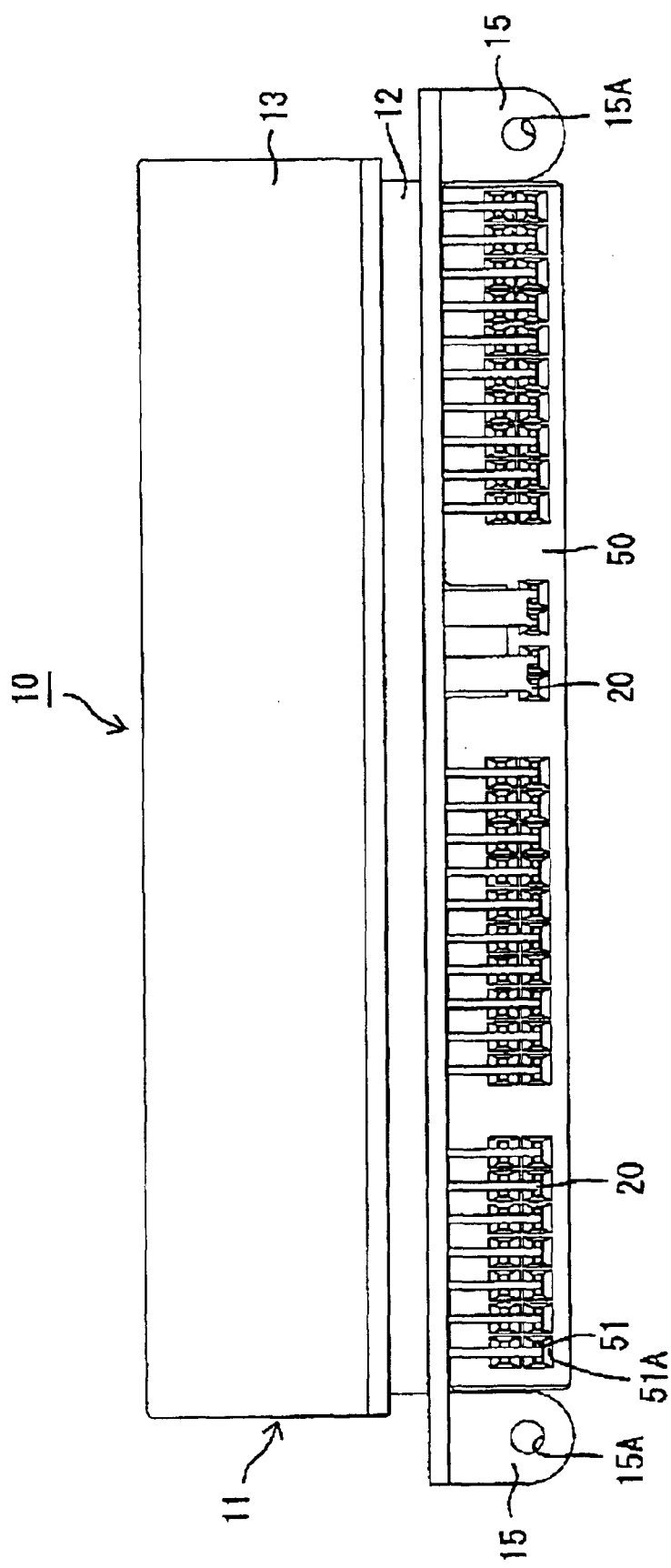
FIG. 3 is a plan view of the circuit board connector.

The circuit board connector 10 has a housing 11 formed e.g. of a synthetic resin. The housing 11 has a wide narrow main body 12, as shown in FIGS. 2 and 3, and a receptacle 13 is formed on the front of the main body 12 for receiving an unillustrated mating housing. Through holes 14 penetrate the main body 12 in forward and backward directions. The through holes 14 are divided into four blocks and are in upper and lower stages in each block.

The connector 10 further includes terminals 20 that are press-formed substantially into long narrow rectangular bars from a metal wire having an excellent electrical conductivity. Each terminal 20 is bent substantially into an L-shape, as shown in FIG. 1, and has a mount portion 21 at one end. The mount portion 21 is pressed from behind into a corresponding through hole 14 in the housing 11. The mount portion 21 projects into the receptacle 13 from the front surface of the main body 12 and can be brought into contact with an unillustrated mating terminal. Each terminal 20 further has a bend 22 at the rear end of the mount portion 21 and a board-connecting portion 25 projects down from the bend 22 substantially normal to the mount portion 21. The board-connecting portions 25 are arranged in front and rear lines, and have their leading ends at substantially the same height.

The connector 10 is mounted on a circuit board 40. The circuit board 40 has electrically conductive paths 42 on the outer surface thereof and is formed with a number of the through holes 41 (see FIG. 6). Contact portions 43 are formed on the inner circumferences of the through holes 41 by, e.g. plating and are connected with the electrically conductive paths 42.

In this embodiment, the terminals 20 come in two kinds: one provided with one board connecting portion 25 and the other provided with forked or multiple board connecting portions 25. The through holes 14 in the main body 12 also come in two kinds having two different widths substantially corresponding to the two kinds of the terminals 20.

Figure 4:
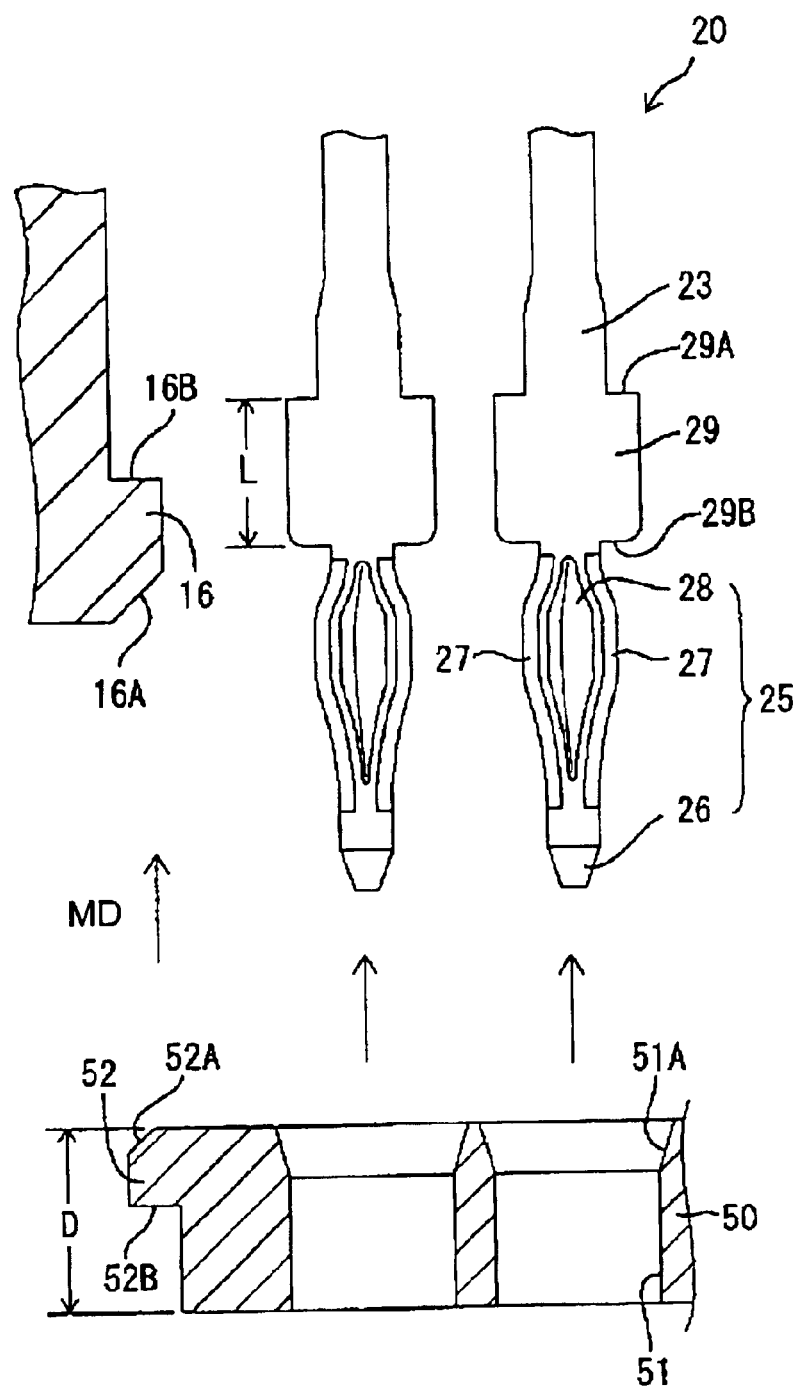
FIG. 4 is a fragmentary section showing a process of assembling a positioning plate with a housing.

A taper 26 is formed at the leading end of each board connecting portion 25, as shown in FIG. 4, and two resilient contacts 27 are formed above or behind the taper 26 as seen in an inserting direction ID of the board connecting portion 25 into the circuit board 40. The two resilient contacts 27 extend over an area of the board connecting portion 25 which is longer, and preferably at least twice as long, as the depth of the through hole 41. The two resilient contacts 27 are thick strips that bulge substantially arcuately out via resiliently deformable portions 28 that are thinner than the resilient contacts 27. A maximal distance between the resilient contacts 27 exceeds the inner diameter of the contact portion 43 of the through hole 41 (see FIGS. 6 and 7). The resilient contacts 27 are inserted in the inserting direction ID into the corresponding through hole 41 and deform inwardly towards each other together with the thinner portions 28 to achieve electrical connection with the contact portion 43.

A jig contact 29 is formed above and behind the resilient contacts 27 with respect to inserting direction ID and projects laterally in a substantially radial direction. The jig contact 29 is a substantially rectangular flat plate with an upper contact edge 29A and a rounded lower edge 29B. A guide 23 is formed right above and behind the jig contact 29 and is slightly wider than a main body of the terminal 20.

A positioning plate 50 is mountable to the rear surface of the housing 11 (see FIGS. 1 to 3) for aligning the terminals 20. The positioning plate 50 is formed e.g. of a synthetic resin and has a width substantially equal to that of the housing 11. Insertion holes 51 extend through the positioning plate 50 and are arranged in four blocks with front and rear lines in each block. Each insertion hole 51 has a cross-sectional dimension to accommodate the jig contact 29A of one of the terminals 20 and a depth D that exceeds a vertical length L of the jig contact 29 along the inserting direction ID (see FIGS. 4 and 6). Slanted surfaces 51A are formed at the upper end of each insertion hole 51 for guiding the board connecting portion 25 and/or the jig contact 29.

Hooks 52 are provided at the opposite ends of the positioning plate 50, as shown in FIG. 3. A slanted guiding surface 52A is defined at the upper corner of each hook 52, and a catching surface 52B extends horizontally along the lower surface of each hook 52.

Fixing arms 15 project at the opposite ends of the rear surface of the housing 11 (see FIGS. 2 and 3) for fixing the housing 11 to the circuit board 40. Each fixing arm 15 is a substantially vertically extending semicylinder with a vertical through hole 15A for receiving a screw. Elongated locking projections 16 are provided at the lower ends of the facing surfaces of the two fixing arms 15 (see FIGS. 2 and 4). A slanted guiding surface 16A is provided at the lower surface of each locking projection 16, and a receiving surface 16B extends substantially horizontally at the upper surface thereof.

Figure 5:
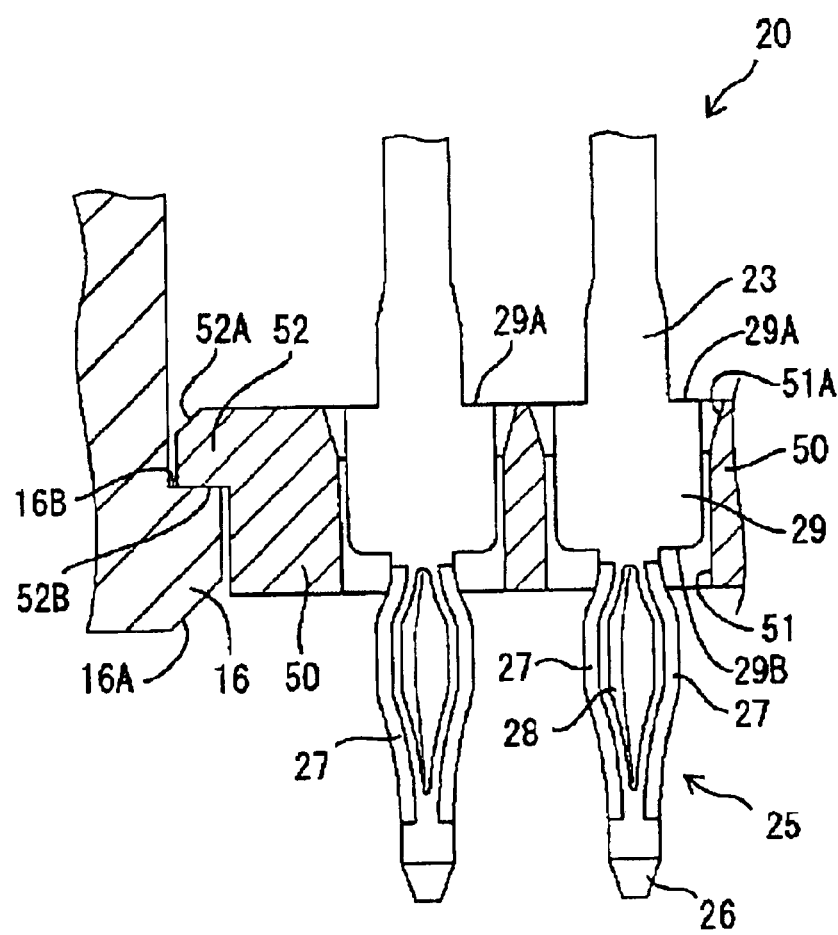
FIG. 5 is a fragmentary section showing a state where the positioning plate is assembled with the housing.

The positioning plate 50 is mounted between the two fixing arms 15 from below the housing 11 (see FIGS. 2 and 4). The positioning plate 50 then is brought closer to the housing 11 to align the insertion holes 51 with the board connecting portions 25. As a result, the tapers 26 of the board connecting portions 25 enter the insertion holes 51 of the positioning plate 50. The guiding surfaces 52A of the hooks 52 of the positioning plate 50 then contact the guiding surfaces 16A of the elongated locking projections 16 on the fixing arms 15. The positioning plate 50 then is pressed up further in a moving direction MD. Thus, the hooks 52 move beyond the elongated locking projections 16, and the catching surfaces 52B of the hooks 52 engage the receiving surfaces 16B of the elongated locking projections 16. Therefore, the positioning plate 50 is caught between the elongated locking projections 16 of the fixing arms 15. At this time, the slanted surfaces 51A of the insertion holes 51 and the corners at the lower edges 29B of the jig contacts 29 are guided mutually so that the jig contacts 29 enter the insertion holes 51. The board connecting portions 25 and the jig contact portions 29 are aligned along the surface of the positioning plate 50 by the insertion holes 51, and the upper surface of the positioning plate 50 and the contact edges 29A of the jig contacts 29 are substantially flush with each other (see FIGS. 2 and 5).

Figure 6:
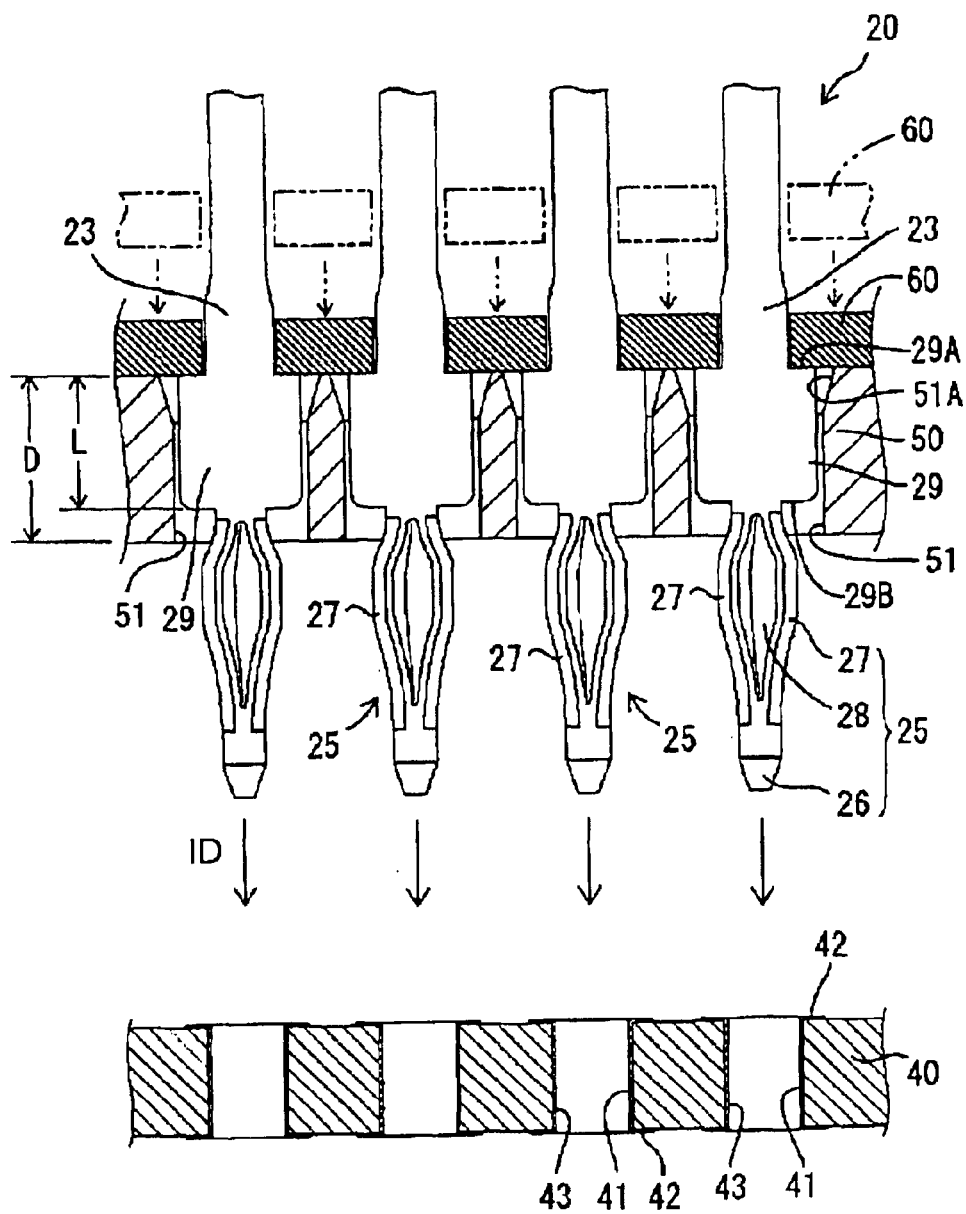
FIG. 6 is a fragmentary section showing a state before resilient contact portions are inserted into a through hole.

The circuit board connector 10 is mounted onto the circuit board 40 using the jig 60 (see FIG. 6). The jig 60 is comb-shaped in plan view and has tooth-like pieces that are insertable between the adjacent guides 23 from above the circuit board connector 10 while being divided into four areas corresponding to the respective blocks of the terminals 20.

The circuit board connector 10 is held on an unillustrated setting apparatus and is vertically movable while having the board-connecting portions 25 faced down. Further, the circuit board 40 is fixed in its horizontal posture substantially normal to the inserting direction ID to the setting apparatus below the circuit board connector 10. Thus, the board-connecting portion 25 of each terminal 20 is positioned right above the corresponding through hole 41 of the circuit board 40.

The tooth-shaped pieces of the jig 60 that have been inserted horizontally between the terminals 20 then are moved along the inserting direction ID and are guided by the inclinations of the guides 23 to positions between the adjacent guides 23 (see phantom-line arrows in FIG. 6). The jig 60 then contacts the upper surface of the positioning plate 50 and/or the contact edges 29A of the jig contacts 29. The jig contacts 29 then are pressed down in the inserting direction ID by the jig 60 together with the positioning plate 50. Thus, the resilient contacts 27 of the board connecting portions 25 are pressed into the through holes 41 by pressing the jig contacts 29 right above the resilient contacts 27 to mount the terminals 20 securely into the circuit board 40 without being bent.

Figure 7:
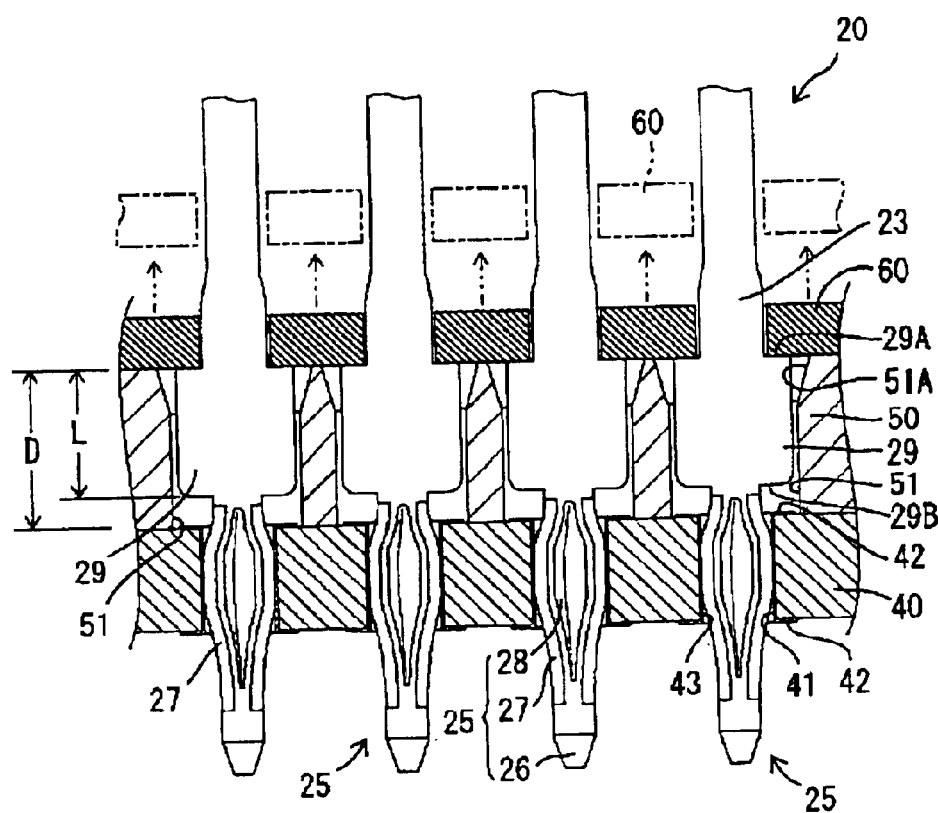
FIG. 7 is a fragmentary section showing a state after the resilient contact portions are inserted into the through hole.
Figure 8:
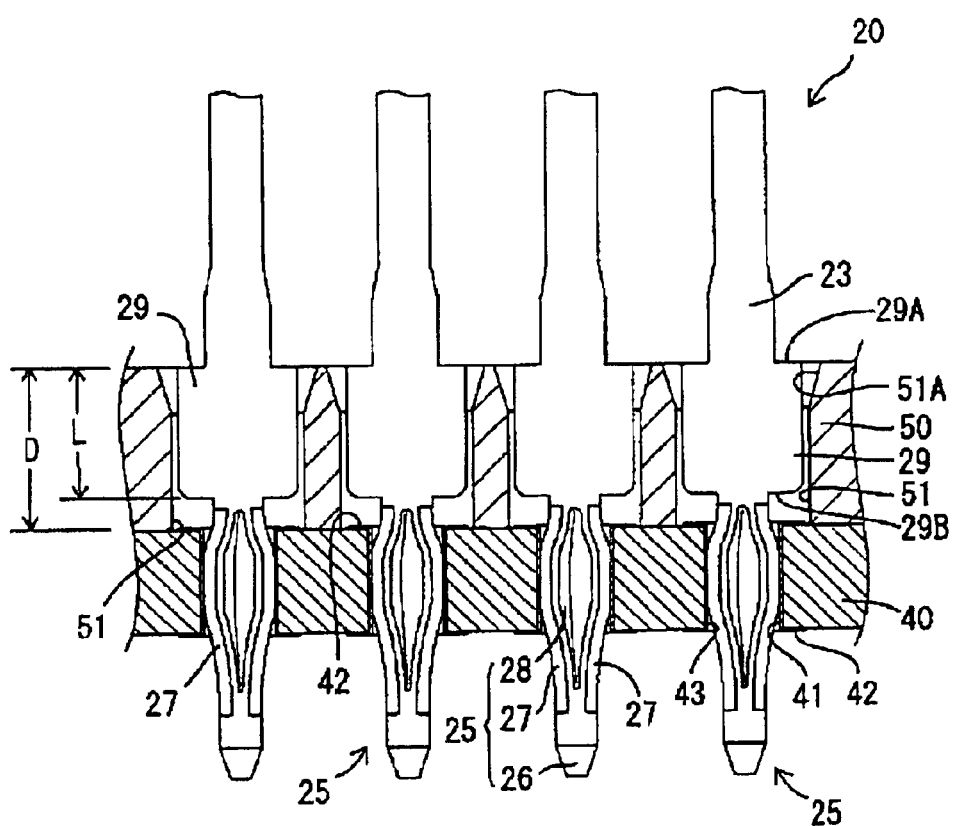
FIG. 8 is a fragmentary section showing a state where the mounting is completed.
Figure 9:
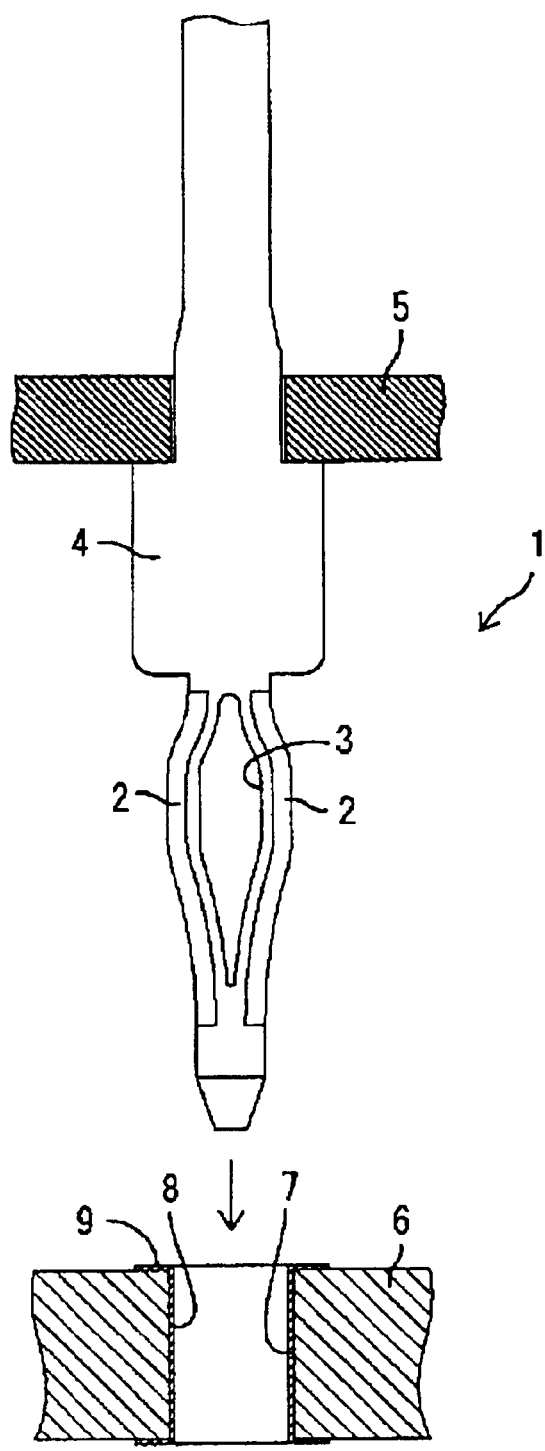
FIG. 9 is a fragmentary section showing a mounting operation of a prior art terminal.

The lower surface of the positioning plate 50 contacts the circuit board 40, as shown in FIG. 7, when the resilient contacts 27 are inserted into the through holes 41 by a specified distance. Thus, any further insertion of the resilient contacts 27 into the through holes 41 is prevented. The resilient restoring forces of the resilient contacts 27 and the resiliently deformable portions 28 act in radial directions to lock the resilient contacts 27 in the through holes 41 and to achieve electrical connection with the contact portions 43. The depth D of the insertion holes 51 exceeds the longitudinal length L of the jig contact portions 29 of the terminals 20. Therefore, the lower edges 29B of the jig contact portions 29 are spaced up and away from the circuit board 40 (see FIGS. 7 and 8). Accordingly, the jig contact portions 29 cannot damage the circuit board 40.

The jig 60 is detached up and away from the circuit board connector 10 and the circuit board 40 (see phantom-line arrows in FIG. 7 and FIG. 8) after the resilient contacts 27 are inserted into the through holes 41. Unillustrated screws then are inserted through the through holes 15A of the fixing arms 15 to fix the housing 11 to the circuit board 40 and to complete the mounting of the circuit board connector 10.

As described above, the depth D of the insertion holes 51 of the positioning plate 50 exceeds the length L of the jig contacts 29. The lower surface of the positioning plate 50 contacts the circuit board 40 to restrict the insertion of the resilient contacts 27 of the terminals 20 and the lower edges 29B are held at a distance from the circuit board 40. As a result, the lower edges 29B of the jig contacts 29 cannot damage the electrically conductive paths 42 formed on the surface of the circuit board 40.

The distance of the resilient contacts 27 to be pressed into the through holes 41 is specified by the depth D of the insertion holes 51, and there is no need of regulating or adjusting the setting apparatus. As a result, the connector 10 can be mounted easily and securely on the circuit board 40.

The jig contact 29 bulges out from the terminal 20 in transverse directions of the connector housing 11 so that the board connecting portions 25 can be pressed easily into the circuit board 40. A space between the jig contacts 29 is reduced if the interval between the terminals 20 is made smaller. However, the jig contacts 29 are accommodated in the through holes 51 of the positioning plate 50 and there is no danger that the jig contacts 29 will contact each other to be short-circuited.

The invention is not limited to the above described and illustrated embodiment. For example, the following embodiments are also embraced by the technical scope of the present invention as defined by the claims. Beside the following embodiments, various changes can be made without departing from the scope and spirit of the present invention as defined by the claims.

In the foregoing embodiment, the depth D of the insertion holes 51 of the positioning plate 50 into which the jig contacts 29 are inserted exceeds the length L of the jig contacts 29. However, it is sufficient that the depth D of the insertion holes 51 is not shorter than the length L of the jig contacts 29. If the depth D of the insertion holes 51 equals the length L of the jig contacts 29, the jig contacts 29 substantially contact the circuit board 40 together with the positioning plate 50. Thus, forces to press the jig contacts 29 can be smaller, and the circuit board 40 will not be damaged.

The circuit board connector 10 has substantially L-shaped terminals 20 mounted along the circuit board 40 in the foregoing embodiment. However, the invention also is applicable to a connector having substantially straight terminals mounted to project from the circuit board 40.

The resilient contacts 27 of the board-connecting portion 25 are formed arcuately via the thin portion 28 in the foregoing embodiment. However, the resilient contacts 27 may be formed without the thin portion 28 therebetween. Alternatively, the board-connecting portion 25 may have an N- or Z-shaped cross section such that the opposite edges thereof are resiliently deformable in and out with respect to radial directions.

The insertion holes 51 of the positioning plate 50 are closed over their entire circumferences in the foregoing embodiment. However, the surfaces thereof may be opened partially and exposed to outside.

The positioning plate 50 has been described as being a substantially flat plate. However, the positioning plate may have projections at the front and/or rear for contact with the circuit board and/or the jig, respectively. In such case the depth D of the insertion hole 51 is the dimension being measured from the outermost contact of the positioning plate with the circuit board and/or the jig, i.e. corresponding to the distance between the jig and the circuit board.

What is claimed is:

1. A construction for mounting at least one terminal, the terminal having at least one resilient contact to be inserted along an inserting direction into a hole in a circuit board, and a jig contact bulging out at an angle to the inserting direction behind the resilient contact with respect to the inserting direction, the jig contact having a width and a longitudinal length, wherein:

the construction comprises a positioning plate with opposite front and rear faces defining a thickness for the positioning plate that is not less than the longitudinal length of the jig contact of the terminal, at least one insertion hole extending through the positioning plate from the front face to the rear face and having a width dimensioned to receive the width of the jig contact at ail positions on the positioning plate between the front and rear faces thereof.

2. The construction of claim 1, wherein the positioning plate Is fixedly mountable to a housing of the circuit board connector.

3. The construction of claim 1, wherein the resilient contacts are radially deformable.

4. The construction of claim 1, wherein the resilient contact is formed adjacent at least one resilient deformable portion that is thinned with respect to the resilient contact.

5. The construction of claim 1, wherein the jig contact has a rounded front edge.

6. A circuit board connector, comprising:

a housing configured for mounting to a circuit board;

terminals mounted into the housing, each of said terminals having at least one resilient contact projecting from the housing and configured for insertion along an insertion direction into a corresponding hole in the circuit board and a jig contact bulging out at an angle to the inserting direction behind the resilient contacts with respect to the inserting direction, each said jig contact having a length along the insertion direction; and a positioning plate assembled with the housing and having opposite front and rear faces defining a thickness for the positioning plate not less than the length of the jig contact of each terminal, insertion holes into which the jig contacts of the terminals are inserted, the insertion holes each having a width at least equal to a width of the jig contacts at all position on the positioning plate between the front and rear faces thereof.

7. The circuit board connector of claim 6, wherein the positioning plate is fixedly mounted to the housing.

8. The circuit board connector of claim 7, wherein the resilient contacts are radially deformable.

9. The circuit board connector of claim 8, further comprising at least one resiliently deformable portion adjacent each of the resilient contacts, each said resilient deformable portion being thinned with respect to the resilient contacts.

10. The circuit board connector of claim 7, wherein the jig contact has a rounded front edge.

11. The circuit board connector of claim 10, wherein the jig contact has rear edges substantially normal to the insertion direction.

12. The circuit board connector of claim 11, wherein the length of each jig contact is less than the depth of each insertion hole.

13. The circuit board connector of claim 12, wherein the positioning plate contacts the circuit board when the housing is mounted on the circuit board.

14. The circuit board connector of claim 13, further comprising a jig removably engageable with the positioning plate and with the rear edges of the jig contacts for urging resilient contacts into the respective holes of the circuit board.

15. A method for mounting a circuit board connector to a circuit board, comprising the following steps:

providing a housing with terminals having resilient contacts for insertion along an insertion direction into corresponding holes in the circuit board and a jig contact bulging out at an angle to the inserting direction from a location behind the respective resilient contact with respect to the inserting direction, each said jig contact having a rear edge and a front edge defining a length for the jig contact along the insertion direction;

providing a positioning plate with front and rear surfaces and insertion holes extending therebetween, the insertion holes having depths at least equal to the lengths of the jig contacts;

inserting the terminals into insertion holes of the positioning plate so that the rear edges of the jig contacts are substantially flush with the rear surface of the positioning plate and so the resilient contacts project beyond the front surface of the positioning plate; and pressing the rear edges of the jig contacts and the rear surface of the positioning plate by a jig to press the resilient contacts into the holes of the circuit board and to position the front surface of the positioning plate substantially against the circuit board, whereby the front edges of the jig contacts are prevented from damaging contact with the circuit board.

* * * * *